(12) United States Patent
Chao et al.

(10) Patent No.: US 8,927,401 B2
(45) Date of Patent: Jan. 6, 2015

(54) TRENCH SCHOTTKY DIODE AND METHOD FOR MANUFACTURING THE SAME

(71) Applicant: PFC Device Corp., New Taipei (TW)

(72) Inventors: Kou-Liang Chao, New Taipei (TW); Hung-Hsin Kuo, New Taipei (TW); Tse-Chuan Su, New Taipei (TW); Mei-Ling Chen, New Taipei (TW)

(73) Assignee: PFC Device Corp., New Taipei (TW)

( * ) Notice: Subject to any disclaimer, the term of this patent is extended or adjusted under 35 U.S.C. 154(b) by 95 days.

(21) Appl. No.: 13/735,176

(22) Filed: Jan. 7, 2013

(65) Prior Publication Data

US 2013/0122695 A1    May 16, 2013

Related U.S. Application Data

(62) Division of application No. 12/824,539, filed on Jun. 28, 2010, now Pat. No. 8,405,184.

(30) Foreign Application Priority Data

Jun. 26, 2009    (TW) ............................... 98121651 A

(51) Int. Cl.
| | |
|---|---|
| H01L 21/28 | (2006.01) |
| H01L 21/44 | (2006.01) |
| H01L 29/66 | (2006.01) |
| H01L 29/06 | (2006.01) |
| H01L 29/40 | (2006.01) |
| H01L 29/872 | (2006.01) |

(52) U.S. Cl.
CPC ...... *H01L 29/66143* (2013.01); *H01L 29/0619* (2013.01); *H01L 29/404* (2013.01); *H01L 29/407* (2013.01); *H01L 29/872* (2013.01); *H01L 29/8725* (2013.01)

USPC .......................... 438/576; 438/578; 438/579

(58) Field of Classification Search
CPC ..................... H01L 29/66143; H01L 29/8725; H01L 29/0619; H01L 29/872
USPC .......................................... 438/576, 578, 579
See application file for complete search history.

(56) References Cited

U.S. PATENT DOCUMENTS 5,365,102 A    11/1994    Mehrotra et al.
6,031,265 A *  2/2000    Hshieh .......................... 257/334

(Continued)

FOREIGN PATENT DOCUMENTS

TW              506130        10/2002
TW              I308395        4/2009

OTHER PUBLICATIONS

Taiwanese Patent Office issued Office Action Oct. 16, 2012.

(Continued)

*Primary Examiner* — Jarrett Stark
(74) *Attorney, Agent, or Firm* — WPAT, PC; Justin King

(57) ABSTRACT

A trench Schottky diode and its manufacturing method are provided. The trench Schottky diode includes a semiconductor substrate having therein a plurality of trenches, a gate oxide layer, a polysilicon structure, a guard ring and an electrode. At first, the trenches are formed in the semiconductor substrate by an etching step. Then, the gate oxide layer and the polysilicon structure are formed in the trenches and protrude above a surface of the semiconductor substrate. The guard ring is formed to cover a portion of the resultant structure. At last, the electrode is formed above the guard ring and the other portion not covered by the guard ring. The protruding gate oxide layer and the protruding polysilicon structure can avoid cracks occurring in the trench structure.

12 Claims, 8 Drawing Sheets

(56) References Cited

U.S. PATENT DOCUMENTS

| | | | |
|---|---|---|---|
| 6,593,620 B1 * | 7/2003 | Hshieh et al. | 257/335 |
| 7,052,982 B2 * | 5/2006 | Hshieh et al. | 438/525 |
| 7,220,661 B1 * | 5/2007 | Yu et al. | 438/570 |
| 2002/0074578 A1 * | 6/2002 | Hshieh et al. | 257/280 |
| 2003/0178673 A1 | 9/2003 | Bhalla et al. | |
| 2005/0035400 A1 | 2/2005 | Shirai et al. | |
| 2005/0127465 A1 | 6/2005 | Chiola | |
| 2005/0181564 A1 * | 8/2005 | Hshieh et al. | 438/270 |
| 2005/0242411 A1 | 11/2005 | Tso | |
| 2006/0209887 A1 | 9/2006 | Bhalla et al. | |
| 2006/0237813 A1 * | 10/2006 | Hshieh et al. | 257/475 |
| 2009/0127593 A1 | 5/2009 | Bhalla et al. | |
| 2009/0294859 A1 * | 12/2009 | Hshieh | 257/368 |
| 2010/0291767 A1 | 11/2010 | Miura | |

OTHER PUBLICATIONS

Taiwan Intellectual Property Office, "Office Action", Jun. 26, 12012, Taiwan.

* cited by examiner

TRENCH SCHOTTKY DIODE AND METHOD FOR MANUFACTURING THE SAME

This application is a divisional application of co-pending U.S. application Ser. No. 12/824,539, filed Jun. 28, 2010, which claims the benefit of Taiwan application Serial No. 98121651, filed on Jun. 26, 2009, the contents of which are incorporated herein by reference.

FIELD OF THE INVENTION

The present invention relates to a Schottky diode and a method for manufacturing the Schottky diode, and more particularly to a method for manufacturing a trench Schottky diode having characteristics of lower reverse leakage current, lower forward voltage drop, higher reverse voltage and less reverse recovery time.

BACKGROUND OF THE INVENTION

A Schottky diode is a unipolar device using electrons as carriers, which is characterized by high switching speed and low forward voltage drop. The limitations of Schottky diodes are the relatively low reverse voltage tolerance and the relatively high reverse leakage current. The limitations are related to the Schottky barrier determined by the metal work function of the metal electrode, the band gap of the intrinsic semiconductor, the type and concentration of dopants in the semiconductor layer, and other factors. For improving the Schottky diode device performance, a trench type Schottky diode was proposed, in which a thermal oxide layer is grown in trenches, and then a polysilicon or metal material is filled in trenches of the device to pinch off the reverse leakage current, so as to reduce the current leakage of the device.

A typical structure of Schottky diode device with MOS trench has been disclosed by U.S. Pat. No. 5,365,102. Please refer to FIGS. 1A-1F illustrating the manufacturing method of the trench MOS barrier Schottky rectifier (TMBSR). As shown in FIG. 1A, a substrate 12 having two opposite surfaces 12a and 12b is provided. The substrate 12 has a relatively heavily-doped cathode region 12c (shown as N+) adjacent to the surface 12a. A relatively lightly-doped drift region 12d (shown as N) preferably extends from the cathode region 12c to the surface 12b. A silicon oxide layer 13 is then grown on the surface 12b to relieve interlayer stress between the substrate 12 and a later-formed silicon nitride layer 15. A photoresist layer 17 is then formed on the silicon nitride layer 15.

In FIG. 1B, a lithography and etching step is performed to partially remove the silicon nitride layer 15, the silicon oxide layer 13 and the substrate 12 so as to form a plurality of discrete mesas 14 in the drift region 12d of the substrate 12 and trench structures 22 with a specific dimension defined by the mesas 14. Referring to FIG. 1C, a thermal oxide layer 16 is formed on the trench sidewalls 22a and the trench bottoms 22b. After removing the remaining portions of the silicon oxide layer 13 and the silicon nitride layer 15, the resultant structure is shown as FIG. 1D. Then, a top metallization step and a backside metallization step are performed to form an anode metal layer 18 on the mesas 14 and a cathode metal layer 20 on the surface 12a (FIG. 1E and 1F). Accordingly, a Schottky barrier contact is formed on the interface between the semiconductor mesas 14 and the anode metal layer 18. The process of manufacturing the TMBSR is thus completed.

The trench Schottky diode manufactured from the aforementioned process may have a low forward voltage drop. Furthermore, the trench structure can pinch off reverse leakage current, such that the current leakage of the TMBSR would less than that of a Schottky diode without any trench structure. However, stress deriving from trench-etching cannot be effectively released and the Schottky diode may be damaged during the reliability test. In particular, the product including the trench Schottky diode possibly malfunctions because of the small cracks caused by the stress.

Therefore, there is a need of providing an improved trench Schottky diode and associated manufacturing method to overcome the problems encountered in the prior art.

SUMMARY OF THE INVENTION

In accordance with an aspect of the present invention, a method for manufacturing a trench Schottky diode is provided. At first, a plurality of trenches are formed in a semiconductor substrate by an etching step. Then, the gate oxide layer and the polysilicon structure are formed in the trenches. Both the gate oxide layer and the polysilicon structure protrude above a surface of the semiconductor substrate. A guard ring is formed at a guard area of the trench Schottky diode to cover portions of the semiconductor substrate, the gate oxide layer and the polysilicon structure while a device area includes the other portions not covered by the guard ring. At last, an electrode is formed over the guard area and the device area.

In an embodiment, the guard ring includes a mask layer and a protective layer for blocking the leakage current. The mask layer has a first pattern. The trenches are formed by etching the semiconductor substrate according to the first pattern. The protective layer is a borophosphosilicate glass layer formed by a CVD process.

In an embodiment, before the step of forming the gate oxide layer, the method includes steps of: etching surfaces of the plurality of trenches to smooth the surfaces of the plurality of trenches; forming a sacrificial oxide layer on the smooth surfaces of the plurality of trenches; and removing the sacrificial layer.

In accordance with another aspect of the present invention, a trench Schottky diode is provided. The trench Schottky diode includes a semiconductor substrate having therein a plurality of trenches, a gate oxide layer, a polysilicon structure, a guard ring and an electrode. The gate oxide layer is formed on surfaces of the trenches, and the polysilicon structure is filled in the trenches covered by the gate oxide layer. The gate oxide layer and the polysilicon structure protrude above the surface of the semiconductor substrate. The guard ring is formed over a guard area of the trench Schottky diode to block leakage current. The electrode covers the guard ring and a device area not covered by the guard ring.

In an embodiment, the electrode includes a first metal layer made of titanium, and a second metal layer made of an alloy of aluminum, silicon and copper.

BRIEF DESCRIPTION OF THE DRAWINGS

The above objects and advantages of the present invention will become more readily apparent to those ordinarily skilled in the art after reviewing the following detailed description and the accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
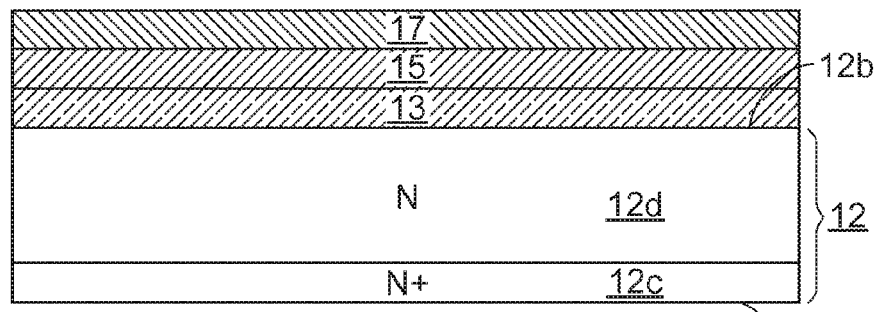
FIGS. 1A to 1F (prior art) illustrate a method for manufacturing a trench Schottky diode device with MOS trenches according to the prior art.
Figure 1B:
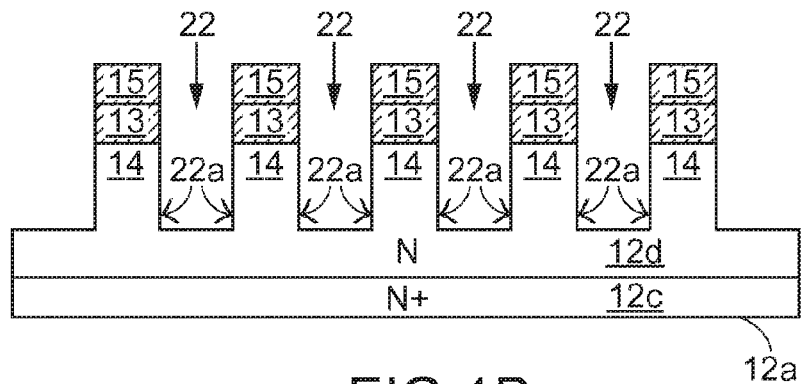
Figure 1C:
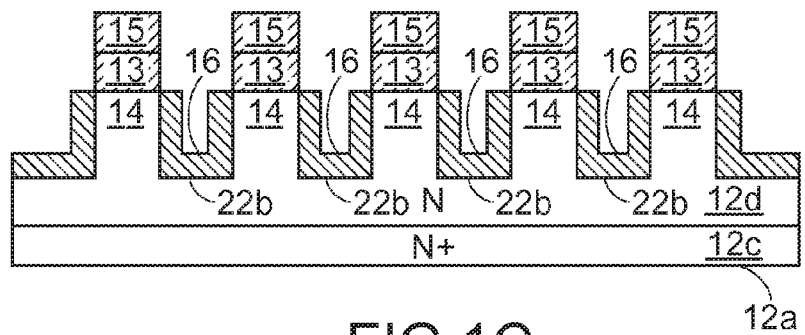
Figure 1D:
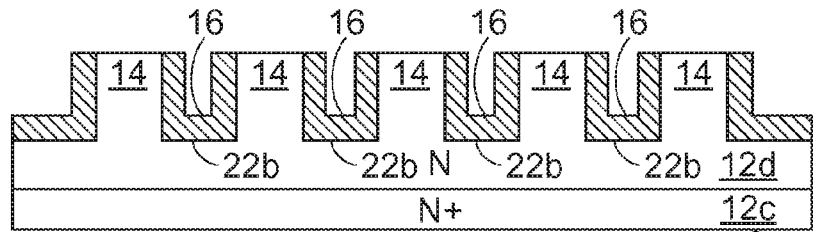
Figure 1E:
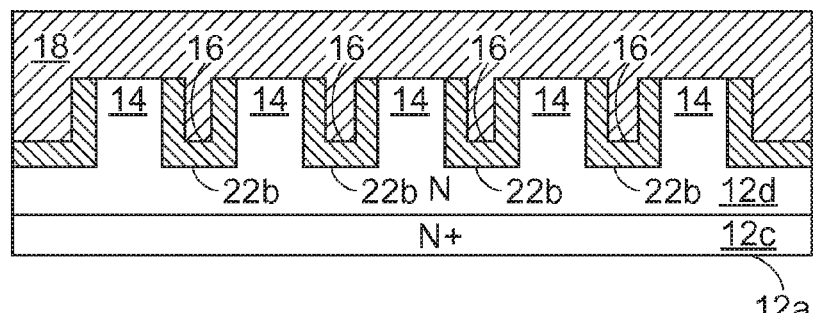
Figure 1F:
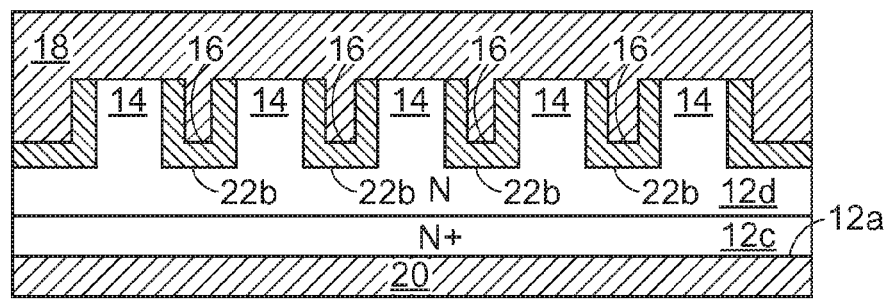
Figure 2A:
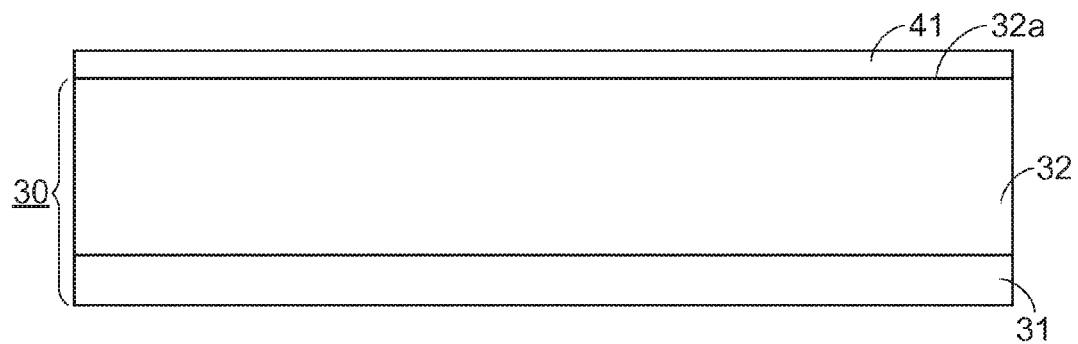
FIGS. 2A to 2O illustrate a method for manufacturing a trench Schottky diode according to a preferred embodiment of the present invention.
Figure 2B:
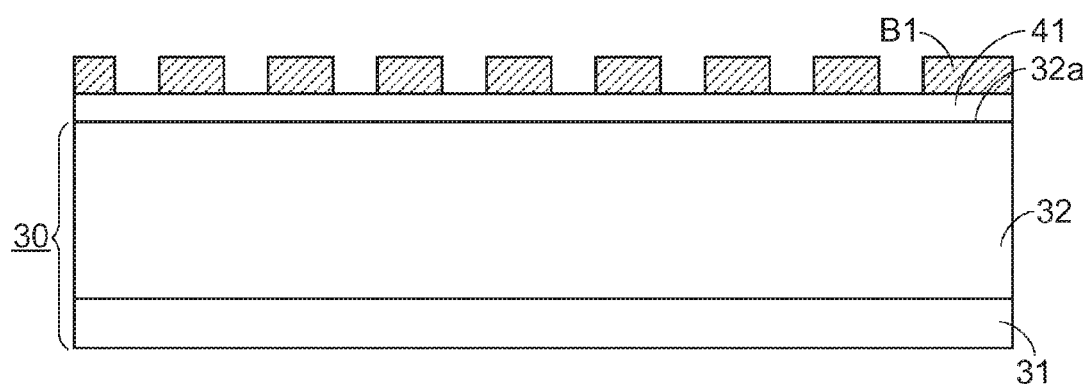
Figure 2C:
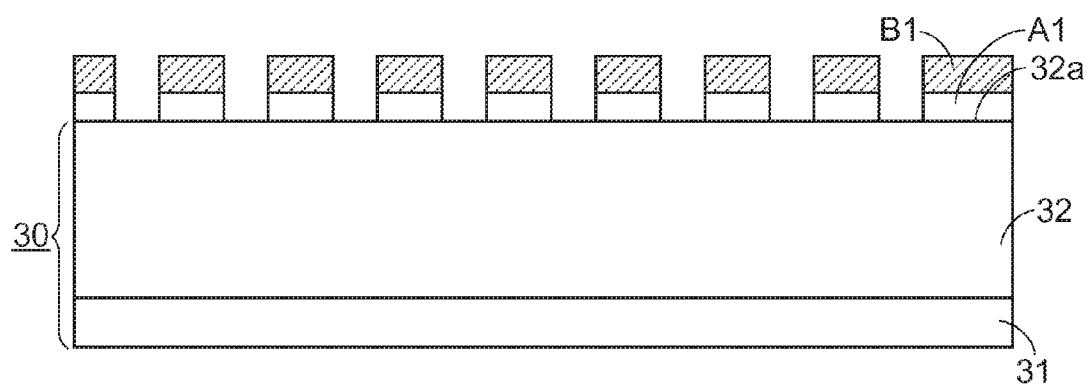
Figure 2D:
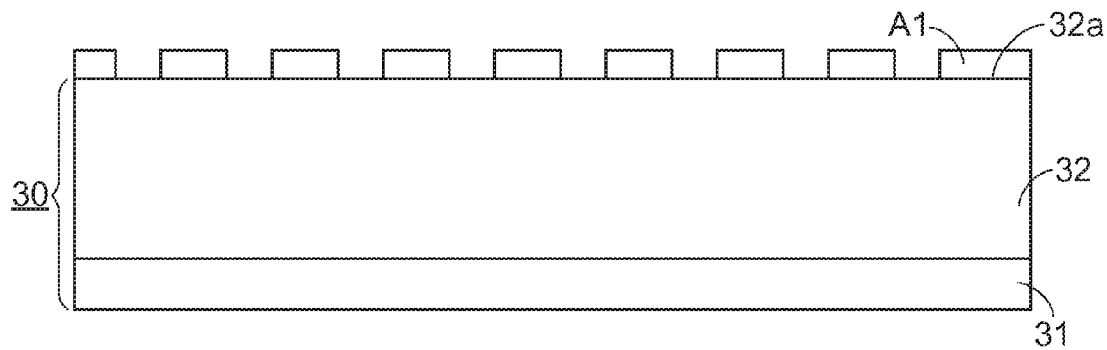
Figure 2E:
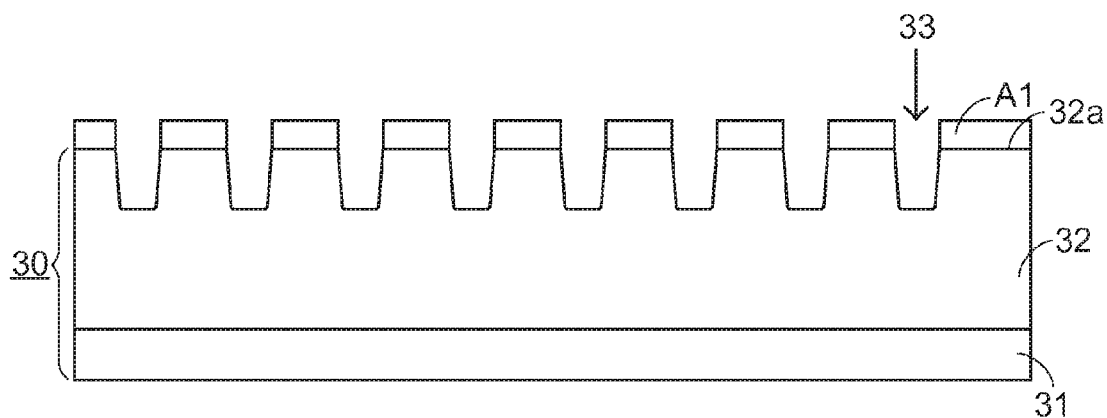
Figure 2F:
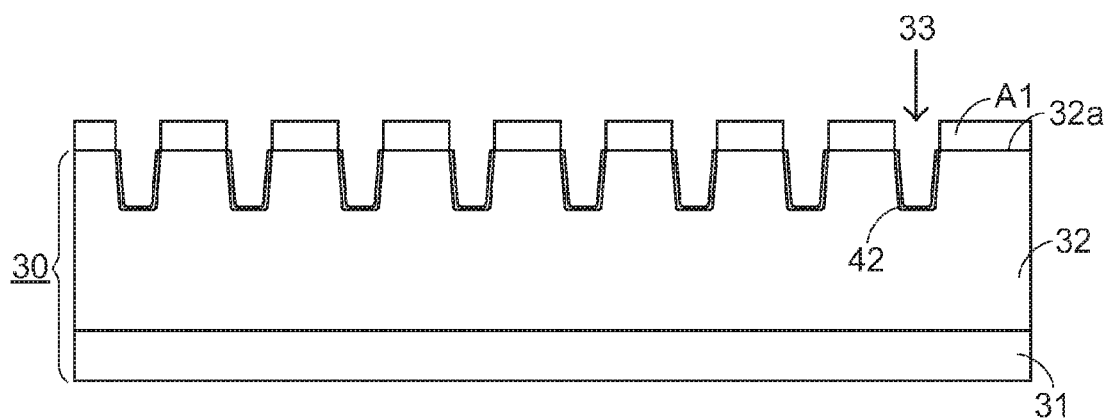
Figure 2G:
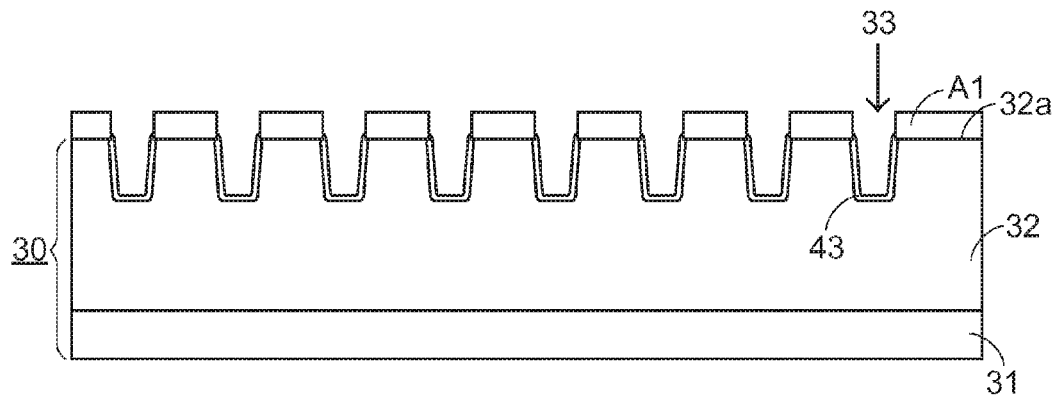
Figure 2H:
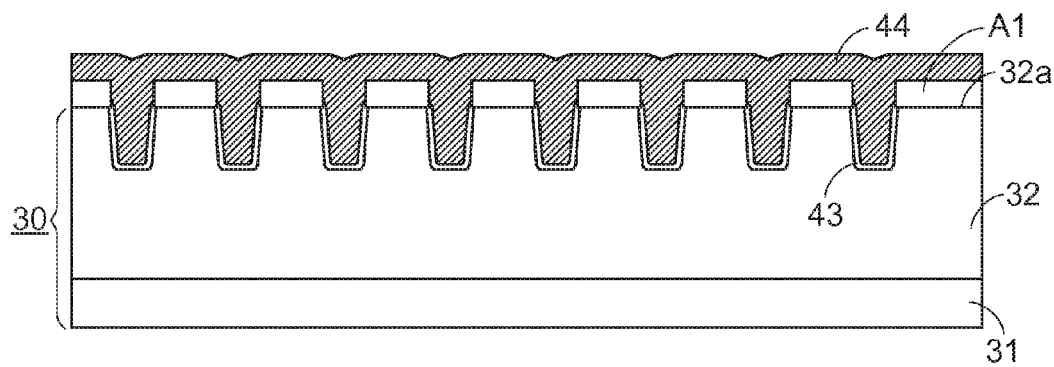
Figure 2I:
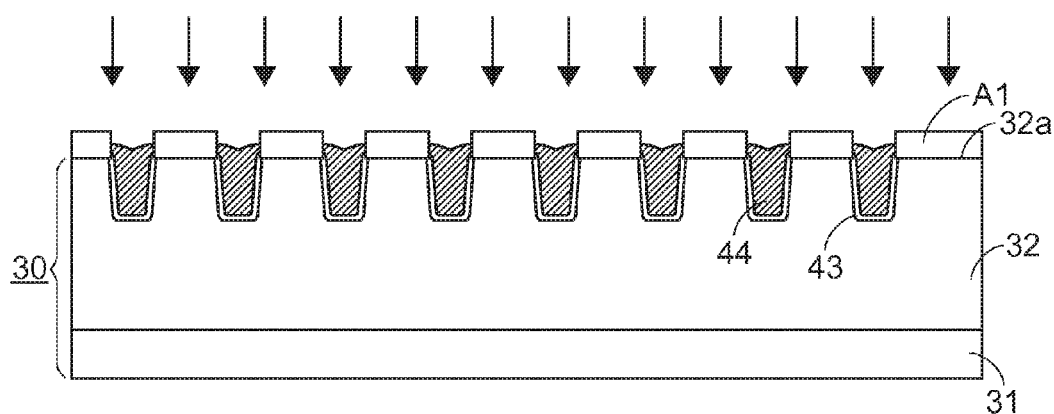
Figure 2J:
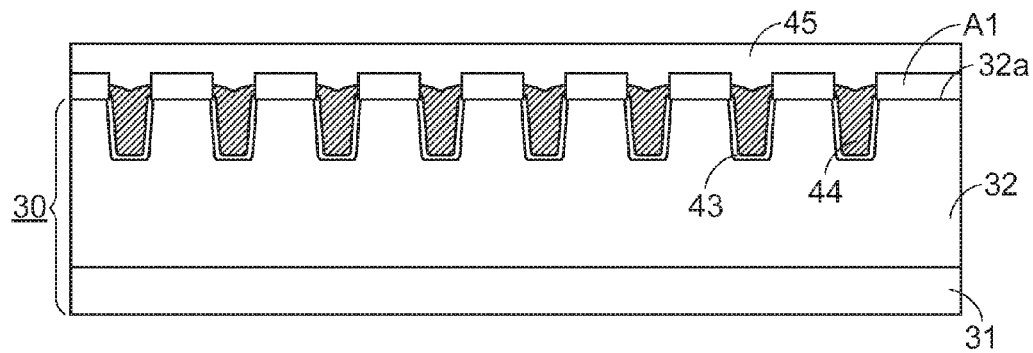
Figure 2K:
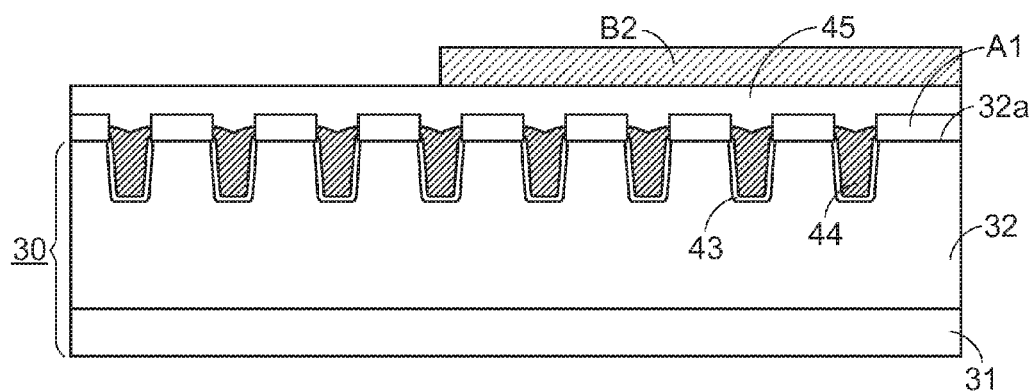
Figure 2L:
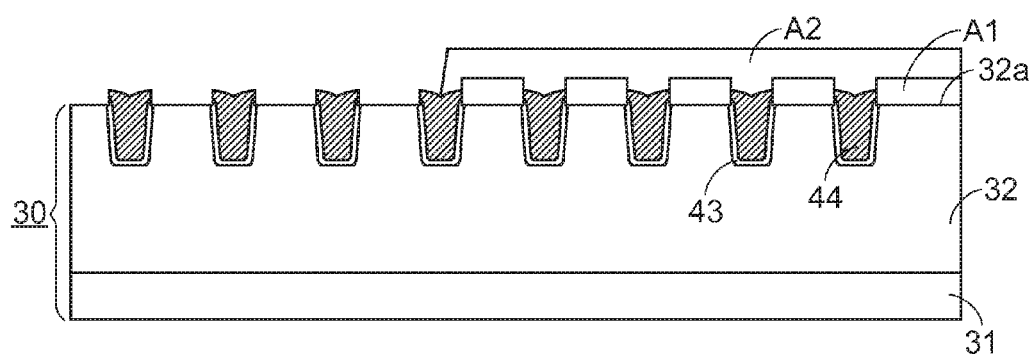
Figure 2M:
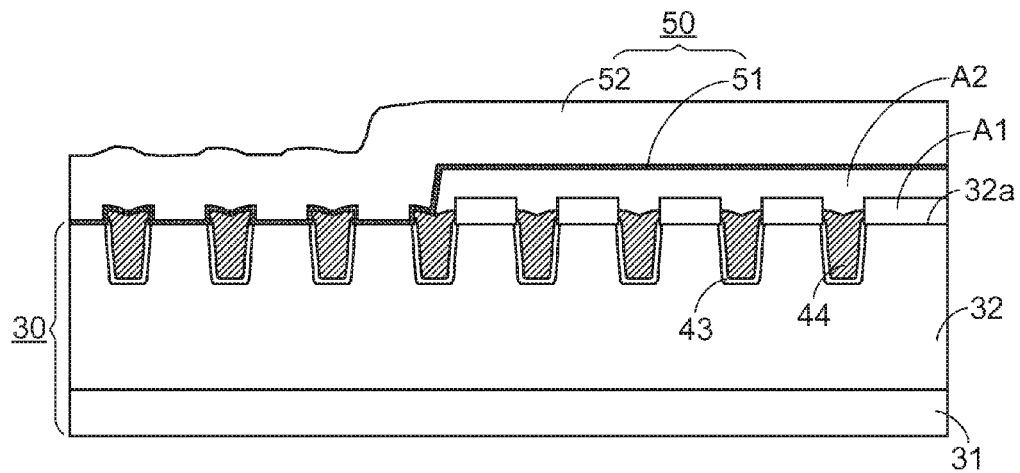
Figure 2N:
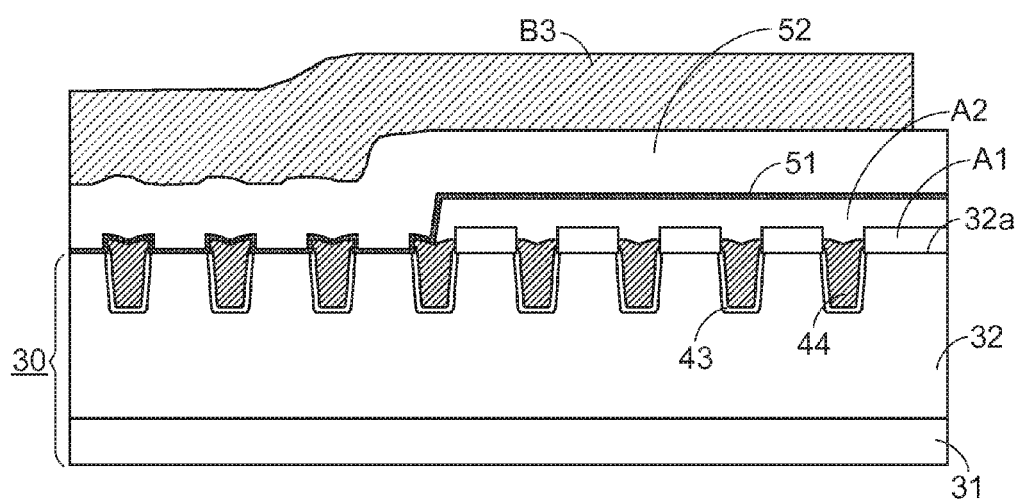
Figure 2O:
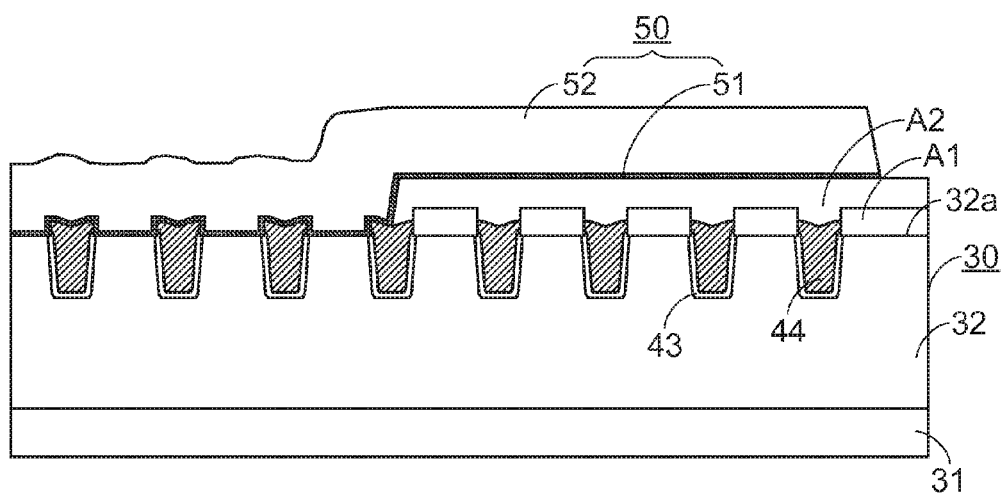

FIGS. 2A to 2O illustrate the method for manufacturing a trench Schottky diode according to a preferred embodiment of the present invention. Please note that the article "a" or "an" may be used for some elements, but the number of the elements is not limited to "one". Referring to FIG. 2A, a semiconductor substrate 30 is first provided. In this embodiment, the semiconductor substrate 30 includes a relatively heavily-doped silicon substrate 31 and a relatively lightly-doped epitaxial layer 32. For the purpose of description, the epitaxial layer 32 shown in FIG. 2 is thicker than the silicon substrate 31 for a subsequent etching process to form a multi-trench structure. In fact, however, the epitaxial layer 32 formed on the silicon substrate 31 is thinner than the silicon substrate 31.

A thermal oxidation process is then performed on a surface 32a of the semiconductor substrate 30, also referred as the surface of the epitaxial layer 32, to form a first oxide layer 41. In an embodiment, the first oxide layer 41 is a silicon oxide layer having a thickness about 6000 Å. As illustrated in FIG. 2B, a first photoresist layer B1 having a first pattern is formed on the first oxide layer 41. Using the first photoresist layer B1 as a mask during an etching process, the first oxide layer 41 is patterned according to the first pattern, so that the first pattern of the first photoresist layer B1 is transferred onto the first oxide layer 41 to form the mask layer A1, as shown in FIG. 2C. The mask layer A1 will serve as a hard mask during another etching process to form a multi-trench structure in the semiconductor substrate 30. In some embodiments, the etching process for patterning the first oxide layer 41 to form the mask layer A1 may be a dry etching process. In another embodiment, the first oxide layer 41 is formed by a chemical vapor deposition (CVD) process.

As mentioned above, after the mask layer A1 is formed on the semiconductor substrate 30, the first photoresist layer B1 is then stripped off, as shown in FIG. 2D. FIG. 2E illustrates that a plurality of trenches 33 are formed in the semiconductor substrate 30 after a trench-etching process using the mask layer A1 is performed on the semiconductor substrate 30. The trenches 33 are then subjected to a trench rounding process to smooth the rough surfaces on the trench bottoms and trench sidewalls of the multi-trench structure. To reduce the roughness of the surfaces of the trenches 33 may increase performance of oxide layers formed on the surfaces.

In an embodiment, the trench rounding process includes several steps. First al all, a downward dry etching step is performed on the surfaces of the trenches 33 to remove about several hundred A of the semiconductor substrate 30 through the trenches 33. The slight etching can significantly smooth the surfaces of the trenches 33. A second oxide layer 42 is subsequently formed on the surfaces of the trenches 33 (i.e. on the trench bottoms and trench sidewalls), as shown in FIG. 2F. The second oxide layer 42 is a thin layer serving as a sacrificial oxide layer. After removing the second oxide layer 42, the smoothness of the surfaces of the trenches 33 are further improved. After the second oxide layer 42 is stripped off, a gate oxide layer 43 is formed on the trench bottoms and trench sidewalls (FIG. 2G). In an embodiment, the gate oxide layer 43 extends upwards along the trench sidewalls and protrudes above the surface 32a of the semiconductor substrate 30. In other words, the protruding portion of the gate oxide layer 43 is in contact with a portion of the mask layer A1.

Then, a polysilicon structure 44 is formed on the gate oxide layer 43 and the mask layer A1, as shown in FIG. 2H. In an embodiment, the polysilicon structure 44 is formed by a CVD process. Thus, the trenches 33 are filled with the polysilicon structure 44, and the polysilicon structure 44 further covers the mask layer A1.

Subsequently, a portion of the polysilicon structure 44 is removed by an etch-back process. No photoresist is required in this downward dry etching process. The polysilicon structure 44 is uniformly etched and the etching depth depends on etching time. As depicted in FIG. 2I, the etch-back process exposes the top surfaces and a portion of the sidewalls of the mask layer A1. Please note that the sidewalls of the mask layer A1 are in contact with the gate oxide layer 43 and the remaining polysilicon structure 44 after the etch-back process. Then, an ion implantation process is performed to introduce impurities into the polysilicon structure 44. In an embodiment, boron or phosphorous ions are uniformly implanted in a certain depth of the polysilicon structure 44, so as to form a P-type or an N-type area in the polysilicon structure 44.

After the ion implantation process, a CVD process is performed to form a borophosphosilicate glass (BPSG) layer 45 on the exposed polysilicon structure 44 and the mask layer A1, as shown in FIG. 2J. BPSG is a type of silicate glass including boron and phosphorous impurities. The BPSG layer 45 has a lower melting point than other oxide layers. When the BPSG layer 45 is heated above the glass-transition temperature (e.g. above 800° C.), the BPSG layer 45 starts to "flow slowly". Accordingly, the BPSG layer 45 can provide a planar profile due to its "fluidity".

After the BPSG layer 45 is formed on the polysilicon structure 44 and the mask layer A1, a second photoresist layer B2 having a second pattern, as shown in FIG. 2K, is then formed on the BPSG layer 45. A portion of the BPSG layer 45 and the mask layer A1 is then etched off according to the second pattern of the second photoresist layer B1. The second photoresist layer B2 is then removed, as shown in FIG. 2L. In an embodiment, the BPSG layer 45 and the mask layer A1 is etched by a contact dry etching process. The contact dry etching process removes all the exposed oxide layers. In other words, the BPSG layer 45 and the mask layer A1 not covered by the second photoresist layer B2 are removed during the contact dry etching process. The remaining BPSG layer 45 is marked as A2 after the contact dry etching process. Thus, portions of the gate oxide layer 43, the polysilicon structure 44 and the semiconductor substrate 30 are exposed, just referred to the left portion of the structure shown in FIG. 2L.

After the contact dry etching process, a metal sputtering process is performed on the remaining BPSG layer A2 and the exposed portions of the gate oxide layer 43, the polysilicon structure 44 and the semiconductor substrate 30 to form a metal sputtering layer 50, as shown in FIG. 2M. In an embodiment, the metal sputtering layer 50 includes a first metal layer 51 and a second metal layer 52. The formation of the first metal layer 51 and the second metal layer 52 are respectively described as follows. A metal sputtering process is first performed on the remaining BPSG layer A2 and the exposed portions of the gate oxide layer 43, the polysilicon structure 44 and the semiconductor substrate 30 to form the first metal layer 51. Therefore, the whole wafer is blanketed by the first metal layer 51. In an embodiment, the first metal layer 51 is made of titanium (Ti).

Subsequently, another metal sputtering process is performed on the first metal layer 51 to form the second metal layer 52 covering the first metal layer 51. In an embodiment, a rapid thermal processing (RTP) step can be performed after the first metal layer 51 is formed, so as to form a metal-silicide layer. The second metal layer 52, which is made of an alloy of aluminum, silicon and copper (Al/Si/Cu), is sputtered onto the first metal layer 51 after the RTP process. Hence, the first metal layer 51 and the relatively lightly-doped epitaxial layer 32 are in contact with each other, which forms a Schottky contact or a Schottky barrier on the surface 32a.

After the metal sputtering layer 50 is formed on the remained BPSG layer A2, the exposed portions of the semiconductor substrate 30, the polysilicon structure 44 and the gate oxide layer 43, a third photoresist layer B3 having a third pattern is formed on the metal sputtering layer 50, as shown in FIG. 2N, to transfer the third pattern onto the metal sputtering layer 50. A portion of the metal sputtering layer 50 is etched off to expose a portion of the remaining BPSG (oxide) layer A2. Then, the third photoresist layer B3 is stripped off, and the resultant structure of a trench Schottky diode is shown in FIG. 2O. In an embodiment, the metal sputtering layer 50 is etched by a metal etching process to form an electrode (anode) of the trench Schottky diode.

Besides, a sintering process may be performed after the metal etching process to enhance adhesion of the metal sputtering layer 50 to the remaining BPSG layer A2, the semiconductor substrate 30, the polysilicon structure 44 and the gate oxide layer 43.

FIG. 2O illustrates the structure of the trench Schottky diode manufactured according to the above-mentioned method. The trench Schottky diode includes a semiconductor substrate 30, a mask layer A1, a gate oxide layer 43, a polysilicon structure 44, a protective layer (e.g. BPSG layer) A2 and a metal sputtering layer 50. There are a plurality of trenches 33 formed in the semiconductor substrate 30. The gate oxide layer 43 is formed on surfaces of the trenches 33 and protrudes above the surface 32a of the semiconductor substrate 30. The polysilicon structure 44 is formed in the trenches 33 covered by the gate oxide layer 43 and protrudes above the surface 32a of the semiconductor substrate 30.

The trench Schottky diode includes a device area and a guard area. In the guard area (right portion in FIG. 2O), the mask layer A1 is formed on the surface 32a of the semiconductor substrate 30 and located between two adjacent trenches 33. The protective layer A2 is formed on the mask layer Al and the polysilicon structure 44. In the device area (left portion in FIG. 2O), no mask or protective layer is provided. The metal sputtering layer 50 including the first metal layer 51 and the second metal layer 52 covers the protective layer A2 in the guard area, and covers the semiconductor substrate 30, the polysilicon structure 44 and the gate oxide layer 43 in the device area.

In comparison with the prior trench Schottky diode, the guard area of the trench Schottky diode of the present invention isolates the device area (with Schottky barrier) from exterior elements. The mask layer A1 and the protective layer A2 in the guard area provide a guard ring for blocking leakage current, so as to reduce the reverse leakage current of the trench Schottky diode. Furthermore, the polysilicon structure 44 and the gate oxide layer 43 both protrude above the surface 32a of the semiconductor substrate 30. Such design can enhance the adhesion of the metal sputtering layer 50 to the polysilicon structure 44 and the gate oxide layer 43 to avoid the cracks occurring along the surface 32a. Hence, the trench Schottky diode provided by the present invention has more reliability than that of the prior art and solves the problems incurred in the prior art.

According to the result of pertinent electrical tests, it is provable that the trench Schottky diode has characteristics of lower reverse leakage current, lower forward voltage drop, higher reverse voltage and less reverse recovery time. The trench Schottky diode remains advantages of conventional Schottky diode such as lower forward voltage drop and rapid reverse recovery time. Furthermore, the trench Schottky diode improves the high reverse leakage current of the conventional Schottky diode by introducing the guard ring. Hence, the present trench Schottky diode is highly competitive.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a trench Schottky diode, comprising steps of:

providing a semiconductor substrate having a first surface;

forming a first mask layer on the first surface, wherein the first mask layer includes a first plurality of openings and a second plurality of opening;

forming a first plurality of trenches and a second plurality of trenches in the semiconductor substrate according to the first mask layer;

forming a first plurality of gate oxide layers correspondingly formed on surfaces of the first plurality of trenches and a second plurality of gate oxide layers correspondingly formed on surfaces of the second plurality of trenches, wherein the first plurality of gate oxide layers and the second plurality of gate oxide layers protrude above the first surface of the semiconductor substrate;

filling a first plurality of polysilicon structures in the first plurality of trenches and a second plurality of polysilicon structures in the second plurality of trenches, wherein the first plurality of polysilicon structures and the second plurality of polysilicon structures protrude above the first surface of the semiconductor substrate;

forming a second mask layer covering mask layer, the first plurality of polysilicon structures and the second plurality of polysilicon structures;

removing a portion of the first mask layer and a portion of the second mask layer, wherein a remained portion of the first mask layer is on a portion of the first surface among the first plurality of trenches and covers the first surface among the first plurality of trenches and the first plurality of gate oxide layers, and wherein a remained portion of the second mask layer is on the remained portion of the first mask layer and the first plurality of polysilicon structures, and completely covers the remained portion of the first mask layer; and forming an electrode on the other portion of the first surface, the remained portion of the second mask layer, the second plurality of the protruding polysilicon structures and the second plurality of the protruding gate oxide layers.

2. The method according to claim 1 wherein the semiconductor substrate comprises a relatively heavily-doped silicon substrate and a relatively lightly-doped epitaxial layer wherein the first plurality of trenches and the second plurality of trenches are formed in the relatively lightly-doped epitaxial layer.

3. The method according to claim 1 wherein the step of forming the first plurality of trenches and the second plurality of trenches further comprises steps of:
forming the first mask layer on the first surface, wherein the first mask layer includes the first plurality of openings and the second plurality of openings; and
etching the semiconductor substrate according to the first plurality of openings and the second plurality of openings of the first mask layer to form the first plurality of trenches and the second plurality of trenches in the semiconductor substrate.

4. The method according to claim 3 wherein the first mask layer is a silicon oxide layer formed by performing a thermal oxidation process or a chemical vapor deposition (CVD) process.

5. The method according to claim 1 wherein before the step of forming the first plurality of gate oxide layers and the second plurality of gate oxide layers, further comprises steps of:
etching surfaces of the first plurality of trenches and the second plurality of trenches to smooth the surfaces of the first plurality of trenches and the second plurality of trenches;
forming a sacrificial oxide layer on the smooth surfaces of the first plurality of trenches and the second plurality of trenches; and
removing the sacrificial layer.

6. The method according to claim 1 wherein the first plurality of polysilicon structures and the second plurality of polysilicon structures are formed by a CVD process.

7. The method according to claim 1, further comprising a step of implanting boron or phosphorous ions into the first plurality of polysilicon structures and the second plurality of polysilicon structures.

8. The method according to claim 1 wherein the second mask layer is a protective layer made of a borophosphosilicate glass (BPSG) layer formed by a CVD process.

9. The method according to claim 1 wherein the step of forming the electrode comprises steps of:
performing a first metal sputtering process on the other portion of the first surface, the remained portion of the second mask layer, the second plurality of the protruding polysilicon structures and the second plurality of the protruding gate oxide layers to form a first metal layer;
performing a second metal sputtering process on the first metal layer to form a second metal layer; and
removing a portion of the first metal layer and the second metal layer on the remained portion of the second mask layer to form the electrode.

10. The method according to claim 9 wherein the first metal layer is made of titanium (Ti), and the second metal layer is made of an alloy of aluminum, silicon and copper (Al/Si/Cu).

11. The method according to claim 9, further comprises a rapid thermal processing (RTP) step after the first metal sputtering process or the second metal sputtering process.

12. The method according to claim 9, further comprises a sintering process after the second metal sputtering process to enhance adhesion of the electrode to the remained portion of the second mask layer.

* * * * *